United States Patent [19]

Takahashi et al.

[11] 4,295,115

[45] Oct. 13, 1981

[54] SEMICONDUCTOR ABSOLUTE PRESSURE TRANSDUCER ASSEMBLY AND METHOD

[75] Inventors: Minoru Takahashi, Katsuta; Takahiko Tanigami, Mito; Kaoru Uchiyama, Katsuta; Hitoshi Minorikawa, Mito; Motohisa Nishihara; Kanji Kawakami, both of Katsuta; Seiko Suzuki, Hitachiota; Hiroaki Hachino, Hitachi; Yutaka Misawa, Katsuta, all of Japan

[73] Assignee: Hitachi, Ltd., Tokyo, Japan

[21] Appl. No.: 27,157

[22] Filed: Apr. 4, 1979

[30] Foreign Application Priority Data

Apr. 5, 1978 [JP] Japan ................................ 53-39191

[51] Int. Cl.³ .............................................. G01L 1/22
[52] U.S. Cl. .................... 338/4; 29/610 SG; 338/42
[58] Field of Search ............. 338/2, 4, 42, 36; 29/610 SG; 357/26; 73/721, 727

[56] References Cited

U.S. PATENT DOCUMENTS

| | | | |
|---|---|---|---|
| 3,397,278 | 8/1968 | Pomerantz | 357/4 Q X |
| 3,697,917 | 10/1972 | Orth et al. | 338/4 X |
| 4,019,388 | 4/1977 | Hall et al. | 338/4 X |
| 4,023,562 | 5/1977 | Hynecek et al. | 73/727 X |
| 4,040,172 | 8/1977 | Kurtz et al. | 338/4 X |

Primary Examiner—C. L. Albritton
Attorney, Agent, or Firm—Craig and Antonelli

[57] ABSTRACT

A semiconductor absolute pressure transducer assembly has a silicon diaphragm assembly and a covering member. The silicon diaphragm assembly has a circular pressure sensitive diaphragm, on the surface of which are diffused piezoresistors and conducting paths. The covering member composed of borosilicate glass has a circular well formed therein. On the surface of the silicon diaphragm assembly on which the piezoresistors and the conducting paths are diffused, a passivating layer of silicon dioxide is deposited. Further on the passivating layer, a conductive layer is formed by, for example, evaporating silicon. And the glass covering member is bonded on the silicon diaphragm assembly by anodic bonding. Namely, the silicon diaphragm assembly and the glass covering member are heated up to a certain high temperature and a relative high voltage applied across the conductive layer of the silicon diaphragm assembly and the glass covering members.

13 Claims, 4 Drawing Figures

SEMICONDUCTOR ABSOLUTE PRESSURE TRANSDUCER ASSEMBLY AND METHOD

BACKGROUND OF THE INVENTION

The present invention relates to a semiconductor absolute pressure transducer, and particularly to method for bonding a covering member of insulating material on a surface of a silicon diaphragm assembly on which piezoresistive elements and conducting paths are constructed.

In U.S. Pat. Nos. 3,918,019 and 4,079,508, there is shown a transducer assembly having a glass substrate and a thin silicon diaphragm upon which is diffused a piezoresistive bridge circuit. Bridge circuit components are properly oriented and connected to bonding pads and conducting paths, both of which are formed on the silicon. The glass substrate has a circular well formed therein having a diameter at least as large as the diameter of the diaphragm. Conducting leads are deposited on the glass substrate in a pattern matching that of the bonding pads on the silicon. The silicon is bonded to the glass substrate with the silicon diaphragm overlying the well in the glass and the bonding pads overlying the conducting leads deposited on the glass by Anodic Bonding method. The bond formed by the method provides a hermetic seal around the well.

Ordinarily, a layer of insulating material such as silicon dioxide ($SiO_2$) is provided on the surface of the silicon for protecting the piezoresistive bridge circuit and the conducting paths formed thereon. In such case, it is very difficult to bond an insulating member, for example the glass substrate, on the surface of the silicon firmly, by the method such as Anodic Bonding. Particularly, this is true when the silicon oxide ($SiO_2$) layer is formed with a thickness of more than 0.5 $\mu m$.

In U.S. Pat. No. 3,595,719, a method of bonding an insulator member to a passivating layer covering a surface of a semiconductor is described. In this method, etching of the passivating layer to a thickness of at least about 1,000 A. with an etchant is performed prior the Anodic Bonding.

If such method is adapted for manufacturing of the transducer assembly mentioned above, the characteristic of the piezoresistive bridge circuit becomes worse, because of a high voltage applied across the p-n juncture thereof. Namely, the silicon diaphragm assembly is n-type and the pressure sensitive resistors of the piezoresistive bridge circuit which are diffused thereon are p-type. When a positive voltage is applied to a silicon and the negative voltage to the glass substrate, leak current flows through the p-n juncture, thereby, affecting the insulating characteristic of the p-n juncture.

Further, the conducting paths are formed by p+ diffusion which yields a low resistivity. However, this p+ diffusion also causes grooves along the paths, though they are very shallow in the depth. And the grooves have influence upon the hermetic seal around the well. In U.S. Pat. Nos. 3,918,019 and 4,079,508, the bonding pads of gold are provided for the hermetic seal.

Another prior art is as follows:

(1) U.S. Pat. No. 3,397,278, "ANODIC BONDING".
This relates to an Anodic Bonding technique.

SUMMARY OF THE INVENTION

An object of the present invention, accordingly, is to provided a semiconductor pressure transducer assembly and method, in which an insulating cover is bonded firmly on a silicon diaphragm assembly with the piezoresistive bridge circuit firmly.

Another object of the present invention is to provide a semiconductor pressure transducer assembly and method free from the drawbacks of the conventional prior art mentioned above.

Moreover, another object of the present invention is to provide a semiconductor pressure transducer assembly that is suitable for mass production.

The objects mentioned above, according to the present invention, are achieved by a semiconductor pressure transducer assembly comprising: a silicon diaphragm assembly upon a surface of which are diffused a strain gauge means of piezoresistor type and conducting paths for electrical connections; a passivating layer covering on the surface of said silicon diaphragm assembly for the purpose of protecting the diffused gauge means and the paths; and a covering member of insulating material mounted on the surface of said silicon diaphragm assembly, in which a layer of conductive material is formed on said passivating layer and a bond between said covering member of insulating material and said conductive layer is formed by an Anodic Bonding method.

These objects and other objects and advantages of the present invention will become apparent from the following detailed description of preferred embodiment given with reference to the accompanying drawings wherein.

DETAILED DESCRIPTION OF PREFERRED EMBODIMENT

Figure 2:
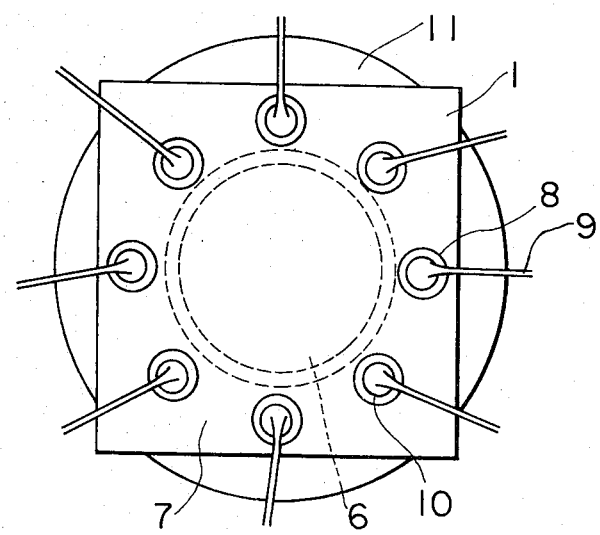
FIGS. 2 and 3 are a top plan view and a cross-sectional view of a silicon diaphragm assembly and a glass covering member of the semiconductor pressure transducer or sensor shown in FIG. 1, respectively.
Figure 3:
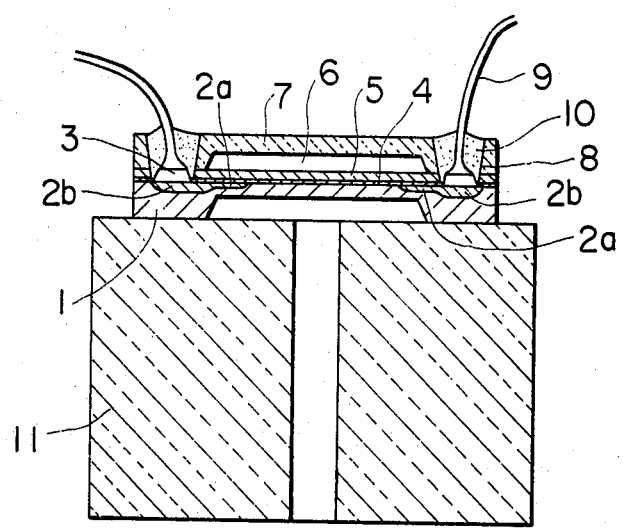

Referring now to drawings, wherein like elements are designated by like reference numerals, particularly to FIGS. 2 and 3, a silicon diaphragm assembly 1 has a supporting rim of thick silicon and a circular pressure sensitive diaphragm of thin silicon formed therein. The starting material used for the fabrication of the silicon diaphragm assembly 1 is n-type. On a surface of the silicon diaphragm assembly 1, piezoresistors 2a of p-type and conducting paths 2b of p+-type are diffused using a wellknown method. Electrodes 3 of aluminum (Al) or of incorruptible three layers of gold (Au), palladium (Pd) and titanium (Ti) are constructed on the conducting paths 2b of p+-type using a method such as spattering or evaporation. And on the surface of the silicon diaphragm assembly 1 on which the piezoresistors 2a and the conducting paths 2b are formed, except the area where the electrodes 3 are constructed, a passivating layer 4 of insulating material such as silicon dioxide ($SiO_2$) is formed. Further on the passivating layer 4, a layer 5 of conductive material such as silicon (Si) is formed using spattering, vapor growth, or evaporation. In place of the silicon, other metals such as aluminum (Al), titanium (Ti), platinium (Pt), palladium (Pd) or beryllium (Be) can be used for forming the conductive layer 5. In the case that silicon is used as the conductive layer 5, since the passivating layer 4 of the silicon dioxide is sandwitched between the deposited polysilicon layer 5 and the silicon diaphragm assembly 1, an initial bend of the silicon diaphragm assembly 1 due to the difference of thermal expansion coefficients can be eliminated, therefore, temperature characteristic of the silicon diaphragm 1 are improved, i.e. the variation of the standard point, such as zero point, with respect to the temperature due to the bend caused by the difference of the thermal expansion coefficients is eliminated. Further, silicon is most preferable because of good stickability to the passivating layer 4 of the silicon dioxide.

On the surface of the silicon diaphragm assembly 1, a covering member 7 is mounted. This covering member 7, for the purpose of improvement of the temperature characteristic, is composed of material which has a thermal expansion coefficient that is substantially equal to that of the silicon, for example borosilicate glass, which is available from Corning Glass Work under the trademark "Pyrex", preferably "Pyrex No. 7740". This borosilicate glass also has the good stickability or adherence to the silicon. A circular well 6 is formed on the bottom side of the glass covering member 7, and eight piercing holes 8 are formed therein at the positions corresponding to the electrodes 3 which are constructed on the silicon diaphragm assembly 1.

The silicon diaphragm assembly 1 and the glass covering member 7, after being treated by respective predetermined processes, are bonded to each other by the Anodic Bonding method. This Anodic Bonding is a technique for bonding semi-conductor or conductor such as silicon and insulator such as glass without bonding pads, and the details thereof is shown, for example, in U.S. Pat. no. 3,397,278. In this embodiment, the silicon diaphragm assembly 1 and the glass covering member 7 are piled up, and a positive pole and a negative pole, the former to the silicon layer 5 and the latter to the glass covering member 7, are provided. Then, these piled silicon diaphragm assembly 1 and glass covering member 7 are placed under a vacuum and heated about 350°. Between these poles, a voltage of 1000 (V) is applied for about 30 minutes. Thereby, the silicon diaphragm assembly 1 and the glass covering member 7 are bonded firmly. Though the above-mentioned Anodic Bonding is not necessary to be conducted under the vacuum condition, the hermetic chamber 6 of of vacuum condition is obtained advantageously. Also, inserting capillaries into the piercing holes 8, conductors 9 such as gold wires are bonded directly by ultra-sonic ball bonding directly, directly.

Further, for the purpose of preventing the conductors and the electrodes from corrosion and migration, plastic coatings 10 of silicon-gel or RTV are mounted on the piercing holes 8.

On the other surface of the silicon diaphragm assembly 1, a member 11 in the shape of a pipe is attached and forms a chamber, in which pressure to be detected is led, from pressure inlet. This pipe member 11 is composed of the borosilicate glass mentioned previously, and is also bonded to the silicon diaphragm assembly 1 by the Anodic Bonding.

Figure 1:
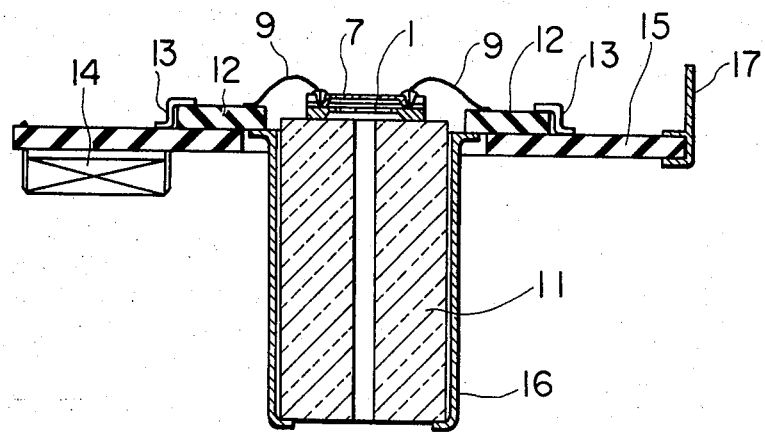
FIG. 1 is a cross-sectional view showing an embodiment of a semiconductor pressure transducer in accordance with the present invention.

As is shown in FIG. 1, the gold wires 9 are bonded to a thick film substrate conductor 12 formed on a substrate 15 including an operational amplifier 14 through lead frames 13.

On the other hand, the conductor 12 is fixed on a tube 16 by bonding pads, and the tube 16 maintains the pipe 11 therein. To the conductor 12, the main substrate 15 is fixed also by bonding pads. At the edge of the main substrate 15, terminals 17 are attached, through which electric output signal is provided.

In the pressure transducer mentioned above, an electric signal proportional to absolute pressure in the inlet, i.e. the relative pressure in the inlet with respect to the vacuum in the hermetic chamber, is obtained by the well-known piezoresistance effect. The output signal is, for example, applied to a micro-computer installed in an automobile, thereby controlling an electronic fuel injector and/or an electronic advance device. And, since the piezoresistive elements 2a are within an inert condition, i.e. covered by an insulator, the piezoresistive characteristics and the insulating characteristics of the p-n juncture formed by them are protected from the emvironment.

Figure 4:
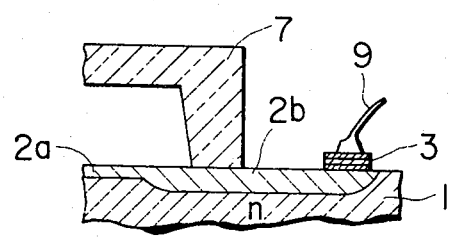
FIG. 4 is a partial cross-sectional view showing another conducting path electrically connecting piezoresistive elements within the glass covering member to the outside in the semiconductor pressure transducer according to the present invention.

In FIG. 4, there is shown another construction of the conducting path 2b which is diffused on the silicon diaphragm assembly 1 other than the above mentioned procedure. For example, the conducting path 2b extends beyond the glass covering member 7, and the above-mentioned three layer electrode 3 of gold-palladium-titanium is constructed on the extended portion thereof. On the electrode 3, the gold wire 9 is bonded by the wire bonding technique.

The construction of the electrode mentioned above is particularly suitable for the mass production because the electrodes can be easily constructed.

While we have shown and described embodiments in accordance with the present invention, it is understood that the same is not limited thereto but is susceptible fo numerous changes and modifications as are obvious to those of ordinary skill in the art, and applicants therefore do not wish to be limited to the details described and shown herein but intended to cover all such changes and modifications as are obvious to those of skill in the art.

What we claim:
1. A semiconductor pressure transducer assembly comprising:
   a silicon diaphragm assembly, on which a pressure sensitive diaphragm is formed;
   piezoresistive elements diffused on the pressure sensitive diaphragm of said silicon diaphragm assembly, the resistance value of the piezoresistive elements varying depending on the strain appearing in the diaphragm;
   conducting paths diffused on said silicon diaphragm assembly for electrical connection of said piezoresistive elements;
   passivating layer covering the surface of said silicon diaphragm assembly, on which surface said piezoresistive elements and said conducting paths are diffused; and
   a covering member of insulating material mounted on the surface of said silicon diaphragm assembly, characterized in that a layer of conductor is disposed between said passivating layer and said covering member, and said conductor layer and said covering member are bonded by Anodic Bonding method.
2. A semiconductor pressure transducer assembly as claimed in claim 1 wherein said covering member is composed of material having a thermal expansion coefficient being substantially equal to that of the silicon.

3. A semiconductor pressure transducer assembly as claimed in claim 2, wherein said covering member is composed of glass.

4. A semiconductor pressure transducer assembly as claimed in claim 3, wherein said covering member is composed of borosilicate glass.

5. A semiconductor pressure transducer assembly as claimed in claim 1, wherein said conductor layer is silicon deposited on the passivating layer of said silicon diaphragm assembly.

6. A semiconductor pressure transducer assembly as claimed in claim 1, wherein said passivating layer is composed of silicon dioxide.

7. A semiconductor pressure transducer assembly as claimed in claim 1, wherein said covering member includes a well formed therein and shaping a chamber together with said silicon diaphragm assembly.

8. A semiconductor pressure transducer assembly as claimed in claim 1, wherein a pipe like member of glass is bonded on the bottom surface of said silicon diaphragm assembly, thereby, shaping a chamber in which a gas having a pressure to be detected is introduced.

9. A semiconductor pressure transducer assembly as claimed in claim 1, plural piercing holes are formed on said covering member at the positions corresponding to said conducting paths of said silicon diaphragm assembly, and electrodes are constructed on the holes of said covering member.

10. A semiconductor pressure transducer assembly as claimed in claim 1, wherein at least one of said conducting paths is diffused on said silicon diaphragm assembly to extend beyond outer edges of said covering member, and wherein an electrode is constructed on the extending portion of said conducting path.

11. A semiconductor pressure transducer assembly as claimed in claim 1, said anodic bonding comprises steps of piling up said silicon diaphragm assembly and said insulating covering member, heating the piled silicon assembly and covering member up to a certain temperature, and applying a voltage for a predetermined period across the piled silicon assembly and covering member with applying the positive voltage to the conductive layer on said silicon diaphragm assembly and the negative voltage to said insulating covering member.

12. A method for forming a semiconductor pressure transducer assembly comprising the steps of:
 (1) forming a pressure sensitive silicon diaphragm;
 (2) diffusing at least one piezoresistive element on the pressure sensitive diaphragm, the resistance value of the piezoresistive element varying depending upon strain appearing in the diaphragm;
 (3) diffusing a conducting path on said silicon diaphragm to provide an electrical connection for said at least one piezoresistive element;
 (4) forming a passivating layer covering a surface of said silicon diaphragm on which the at least one piezoresistive element and said conductive path are diffused;
 (5) providing a layer of conductor on the passivating layer, to form a silicon diaphragm assembly;
 (6) mounting a covering member of insulating material on the conductor layer of said silicon diaphragm assembly; and
 (7) bonding said covering member to said conductor layer by Anodic Bonding.

13. A method as claimed in claim 12, wherein said covering member is formed of glass and the conductor layer is formed of silicon.

* * * * *